United States Patent
Xiao

(10) Patent No.: US 9,728,147 B2
(45) Date of Patent: Aug. 8, 2017

(54) GOA CIRCUIT OF LTPS SEMICONDUCTOR TFT

(71) Applicant: Shenzhen China Star Optoelectronics Technology Co., Ltd., Shenzhen, Guangdong (CN)

(72) Inventor: Juncheng Xiao, Shenzhen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 219 days.

(21) Appl. No.: 14/422,700

(22) PCT Filed: Feb. 6, 2015

(86) PCT No.: PCT/CN2015/072358
§ 371 (c)(1),
(2) Date: Feb. 19, 2015

(87) PCT Pub. No.: WO2016/070513
PCT Pub. Date: May 12, 2016

(65) Prior Publication Data
US 2016/0343323 A1    Nov. 24, 2016

(30) Foreign Application Priority Data
Nov. 3, 2014 (CN) .......................... 2014 1 0612223

(51) Int. Cl.
*G09G 3/36* (2006.01)
*H01L 27/12* (2006.01)
*H01L 29/786* (2006.01)
*G11C 19/28* (2006.01)

(52) U.S. Cl.
CPC ......... *G09G 3/3648* (2013.01); *G09G 3/3677* (2013.01); *G11C 19/28* (2013.01); *H01L 27/124* (2013.01); *H01L 27/1222* (2013.01); *H01L 29/78672* (2013.01); *G09G 2310/0283* (2013.01); *G09G 2310/0286* (2013.01); *G09G 2310/0291* (2013.01); *G09G 2310/061* (2013.01); *G09G 2310/08* (2013.01); *G09G 2330/021* (2013.01)

(58) Field of Classification Search
None
See application file for complete search history.

*Primary Examiner* — Tony N Ngo
(74) *Attorney, Agent, or Firm* — Andrew C. Cheng

(57) ABSTRACT

The present invention provides a GOA circuit of LTPS semiconductor TFT, employed for forward-backward bidirectional scan transmission, comprising a plurality of GOA units which are cascade connected, and N is set to be a positive integer and an Nth GOA unit utilizes a plurality of N-type transistors and a plurality of P-type transistors and comprises a transmission part (100), a transmission control part (200), an information storage part (300), a data erase part (400), an output control part (500) and an output buffer part (600). The transmission gate is employed to perform the former-latter level transferring signal, and the NOR gate logic unit and the NAND gate logic unit are employed to convert the signals, and the sequence inverter and the inverter are employed to save and transmit the signals to solve the issues that the stability of the circuit is poor, and the power consumption is larger as concerning the LTPS with single type TFT elements, and the problem of TFT leakage of the single type GOA circuit to optimize the performance of the circuit. The ultra narrow frame or frameless designs can be realized.

13 Claims, 6 Drawing Sheets

GOA CIRCUIT OF LTPS SEMICONDUCTOR TFT

FIELD OF THE INVENTION

The present invention relates to a display technology field, and more particularly to a GOA circuit of LTPS semiconductor TFT.

BACKGROUND OF THE INVENTION

GOA (Gate Drive On Array) is to manufacture the gate driver on the array substrate by utilizing the Thin Film Transistor (TFT) liquid crystal display array process for achieving the driving method of scanning line by line.

Generally, the GOA circuit comprises a pull-up part, a pull-up controlling part, a transfer part, a pull-down part, a pull-down holding part and a boost part in charge of boosting voltage level. The boost part generally comprises a bootstrap capacitor.

The pull-up part is mainly in charge of outputting the inputted clock signal (Clock) to the gate of the thin film transistor as being the driving signals of the liquid crystal display. The pull-up control part is mainly in charge of activating the pull-up part, and is generally functioned by the signal transferred from the former GOA circuit. The pull-down part is mainly in charge of rapidly pulling down the scan signal (i.e. the voltage level of the gate of the thin film transistor) to be low voltage level after outputting the scanning signal. The pull-down holding circuit part is mainly in charge of maintaining the scanning signal and the signal of the pull-up part in an off state (i.e. the set negative voltage level). The boost part in mainly in charge of performing a second boost to the voltage level of the pull-up part for ensuring the normal output of the pull-up part.

With the development of the LTPS semiconductor TFT, the LTPS-TFT LCD also becomes the focus that people pay lots of attentions. Because the LTPS semiconductor has better order than amorphous silicon (a-Si) and the LTPS itself has extremely high carrier mobility which can be more than 100 times of the amorphous silicon semiconductor, which the GOA skill can be utilized to manufacture the gate driver on the TFT array substrate to achieve the objective of system integration and saving the space and the cost of the driving IC. However, as considering the LTPS-TFT, the single type (single N-type or single P-type) GOA circuit has issues that the structure is complex, and the circuit property is poor, and particularly the power consumption is large. Especially, as mentioning the application in the small and medium size field, the power consumption is an important index of the performance. Therefore, how to reduce the power consumption and strengthen the circuit structure and the stability of the entire performance has become an important agenda faced by the GOA circuit of LTPS semiconductor TFT.

SUMMARY OF THE INVENTION

An objective of the present invention is to provide a GOA circuit of LTPS semiconductor TFT to solve the issues that the stability of the circuit is poor, and the power consumption is larger as concerning the LTPS with single type TFT elements; the problem of TFT leakage of the single type GOA circuit can be solved to optimize the performance of the circuit; meanwhile, the ultra narrow frame or frameless designs can be realized.

For realizing the aforesaid objective, the present invention provides a GOA circuit of LTPS semiconductor TFT, employed for forward-backward bidirectional scan transmission, comprising a plurality of GOA units which are cascade connected, and N is set to be a positive integer and an Nth GOA unit utilizes a plurality of N-type transistors and a plurality of P-type transistors and comprises a transmission part, a transmission control part, an information storage part, a data erase part, an output control part and an output buffer part;

the transmission part is electrically coupled to a first low frequency signal, a second low frequency signal, a driving output end of an N−1th GOA unit which is the former stage of the Nth GOA unit, a driving output end of an N+1th GOA unit which is the latter stage of the Nth GOA unit and the information storage part; the transmission control part is electrically coupled to the driving output end of the N+1th GOA unit which is the latter stage of the Nth GOA unit, the driving output end of the N−1th GOA unit which is the former stage of the Nth GOA unit, an M−2th sequence signal, a high voltage source, a low voltage source and the information storage part; the information storage part is electrically coupled to the transmission part, the transmission control part, the data erase part, the high voltage source and the low voltage source; the data erase part is electrically coupled to the information storage part, the output control part, the high voltage source and the reset signal end; the output control part is electrically coupled to the data erase part, the output buffer part, a driving output end, a sequence signal, the high voltage source and the low voltage source; the output buffer part is electrically coupled to the output control part, an output end, the high voltage source and the low voltage source;

voltage levels of the first low frequency signal and the second low frequency signal are switched along with the forward-backward scan, and the first low frequency signal is equivalent to a direct current high voltage level, and the second low frequency signal is equivalent to a direct current low voltage level as forward scan; the first low frequency signal is equivalent to a direct current low voltage level, and the second low frequency signal is equivalent to a direct current high voltage level as backward scan;

the transmission part comprises:

a first P-type transistor, and a gate of the first P-type transistor is electrically coupled to the second low frequency signal, and a source is electrically coupled to the driving output end of the N−1th GOA unit which is the former stage of the Nth GOA unit, and a drain is electrically coupled to a first node;

a second N-type transistor, and a gate of the second N-type transistor is electrically coupled to the first low frequency signal, and a source is electrically coupled to the driving output end of the N−1th GOA unit which is the former stage of the Nth GOA unit, and a drain is electrically coupled to the first node;

a third P-type transistor, and a gate of the third P-type transistor is electrically coupled to the first low frequency signal, and a source is electrically coupled to the driving output end of the N+1th GOA unit which is the latter stage of the Nth GOA unit, and a drain is electrically coupled to a second node;

a fourth N-type transistor, and a gate of the fourth N-type transistor is electrically coupled to the second low frequency signal, and a source is electrically coupled to the driving output end of the N+1th GOA unit which is the latter stage of the Nth GOA unit, and a drain is electrically coupled to the second node;

the transmission control part comprises:

a fifth P-type transistor, and a gate of the fifth P-type transistor is electrically coupled to the driving output end of the N−1th GOA unit which is the former stage of the Nth GOA unit, and the source is electrically coupled to the high voltage source, and a drain is electrically coupled to a source of a sixth P-type transistor;

the sixth P-type transistor, and a gate of the sixth P-type transistor is electrically coupled to the driving output end of the N+1th GOA unit which is the latter stage of the Nth GOA unit, and a source is electrically coupled to the drain of the fifth P-type transistor, and a drain is electrically coupled to a source of a seventh N-type transistor;

the seventh N-type transistor, and a gate of the seventh N-type transistor is electrically coupled to the driving output end of the N−1th GOA unit which is the former stage of the Nth GOA unit, and a source is electrically coupled to the drain of the sixth P-type transistor, and a drain is electrically coupled to the low voltage source;

an eighth N-type transistor, and the gate of the eighth N-type transistor is electrically coupled to the driving output end of the N+1th GOA unit which is the latter stage of the Nth GOA unit, and the source is electrically coupled to the drain of the sixth P-type transistor, and a drain is electrically coupled to the low voltage source;

a ninth P-type transistor, and a gate of the ninth P-type transistor is electrically coupled to the drain of the sixth P-type transistor, and a source is electrically coupled to the high voltage source, and a drain is electrically coupled to a source of a tenth N-type transistor;

the tenth N-type transistor, and a gate of the tenth N-type transistor is electrically coupled to the drain of the sixth P-type transistor, and the source is electrically coupled to the drain of the ninth P-type transistor, and a drain is electrically coupled to the low voltage source;

an eleventh P-type transistor, a gate of the eleventh P-type transistor is electrically coupled to the drain of the sixth P-type transistor, and a source is electrically coupled to a source of a twelfth N-type transistor, and a drain is electrically coupled to the M−2th sequence signal;

the twelfth N-type transistor, and a gate of the twelfth N-type transistor is electrically coupled to the drain of the ninth P-type transistor, and the source is electrically coupled to the source of the eleventh P-type transistor, and a drain is electrically coupled to the M−2th sequence signal;

the information storage part comprises:

a thirteenth N-type transistor, and a gate of the thirteenth N-type transistor is electrically coupled to the source of the eleventh P-type transistor, and a source is electrically coupled to a drain of a fourteenth P-type transistor, and a drain is electrically coupled to the low voltage source;

the fourteenth P-type transistor, and a gate of the fourteenth P-type transistor is electrically coupled to the source of the eleventh P-type transistor, and a source is electrically coupled to the high voltage source, and the drain is electrically coupled to the source of the thirteenth N-type transistor;

a fifteenth P-type transistor, and a gate of the fifteenth P-type transistor is electrically coupled to the source of the thirteenth N-type transistor, and a source is electrically coupled to the high voltage source, and a drain is electrically coupled to a source of a sixteenth P-type transistor;

the sixteenth P-type transistor, and a gate of the sixteenth P-type transistor is electrically coupled to the first node, and the source is electrically coupled to the drain of the fifteenth P-type transistor, and a drain is electrically coupled to a source of a seventeenth N-type transistor;

the seventeenth N-type transistor, and a gate of the sixteenth P-type transistor is electrically coupled to the first node, and the source is electrically coupled to the drain of the sixteenth P-type transistor, and a drain is electrically coupled to a source of an eighteenth N-type transistor;

the eighteenth N-type transistor, and a gate of the eighteenth N-type transistor is electrically coupled to the source of the eleventh P-type transistor, and the source is electrically coupled to the drain of the seventeenth N-type transistor, and a drain is electrically coupled to the low voltage source;

a nineteenth P-type transistor, and a gate of the nineteenth P-type transistor is electrically coupled to the gate of the thirteenth N-type transistor, and a source is electrically coupled to the high voltage source, and a drain is electrically coupled to a source of a twentieth P-type transistor;

the twentieth P-type transistor, and a gate of the twentieth P-type transistor is electrically coupled to the second node, and the source is electrically coupled to the drain of the nineteenth P-type transistor, and a drain is electrically coupled to a source of a twenty-first N-type transistor;

the twenty-first N-type transistor, and a gate of the twenty-first N-type transistor is electrically coupled to the second node, and the source is electrically coupled to the drain of the twentieth P-type transistor, and a drain is electrically coupled to a source of a twenty-second N-type transistor;

the twenty-second N-type transistor, and a gate of the twenty-second N-type transistor is electrically coupled to the source of the thirteenth N-type transistor, and the source is electrically coupled to the drain of the twenty-first N-type transistor, and a drain is electrically coupled to the low voltage source;

the data erase part comprises:

a twenty-third P-type transistor, and a gate of the twenty-third P-type transistor is electrically coupled to the reset signal end, and a source is electrically coupled to the high voltage source, and a drain is electrically coupled to the drain of the sixteenth P-type transistor and the drain of the twentieth P-type transistor;

the output control part comprises:

a twenty-fourth P-type transistor, and a gate of the twenty-fourth P-type transistor is electrically coupled to the drain of the sixteenth P-type transistor and the drain of the twentieth P-type transistor, and a source is electrically coupled to the high voltage source, and a drain is electrically coupled to the driving output end;

a twenty-fifth N-type transistor, and a gate of the twenty-fifth N-type transistor is electrically coupled to the drain of the sixteenth P-type transistor and the drain of the twentieth P-type transistor, and a source is electrically coupled to the driving output end, and a drain is electrically coupled to the low voltage source;

a twenty-sixth P-type transistor, and a gate of the twenty-sixth P-type transistor is electrically coupled to the driving output end, and a source is electrically coupled to the high voltage source, and a drain is electrically coupled to a source of a twenty-ninth N-type transistor;

a twenty-seventh N-type transistor, and a gate of the twenty-seventh N-type transistor is electrically coupled to the driving output end, and a source is electrically coupled to a drain of the twenty-ninth N-type transistor, and a drain is electrically coupled to the low voltage source;

a twenty-eighth P-type transistor, and a gate of the sixteenth P-type transistor is electrically coupled to the sequence signal, and a source is electrically coupled to the high voltage source, and a drain is electrically coupled to the source of the twenty-ninth N-type transistor;

the twenty-ninth N-type transistor, and a gate of the twenty-ninth N-type transistor is electrically coupled to the sequence signal, and the source is electrically coupled to the drain of twenty-sixth P-type transistor, and a drain is electrically coupled to the source of the twenty-seventh N-type transistor;

the output buffer part comprises:

a thirtieth P-type transistor, and a gate of the thirtieth P-type transistor is electrically coupled to the source of the twenty-ninth N-type transistor, and a source is electrically coupled to the high voltage source, and a drain is electrically coupled to a source of a thirty-first N-type transistor;

the thirty-first N-type transistor, and a gate of the thirty-first N-type transistor is electrically coupled to the source of the twenty-ninth N-type transistor, and the source is electrically coupled to the drain of the thirtieth P-type transistor, and a drain is electrically coupled to the low voltage source;

a thirty-second P-type transistor, and a gate of the thirty-second P-type transistor is electrically coupled to the drain of the thirtieth P-type transistor, and a source is electrically coupled to the high voltage source, and a drain is electrically coupled to a source of a thirty-third N-type transistor;

the thirty-third N-type transistor, and a gate of the thirty-third N-type transistor is electrically coupled to the drain of the thirtieth P-type transistor, and the source is electrically coupled to the drain of the thirty-second P-type transistor, and a drain is electrically coupled to the low voltage source;

a thirty-fourth P-type transistor, and a gate of the thirty-fourth P-type transistor is electrically coupled to the drain of the thirty-second P-type transistor, and a source is electrically coupled to the high voltage source, and a drain is electrically coupled to the output end;

a thirty-fifth N-type transistor, and a gate of the thirty-fifth N-type transistor is electrically coupled to the drain of the thirty-second P-type transistor, and a source is electrically coupled to the output end, and a drain is electrically coupled to the low voltage source.

The GOA circuit further comprises a second output control part, a second output buffer part;

the second output control part is electrically coupled to the output control part, the driving output end, an M+1th sequence signal, the high voltage source and the low voltage source; the second output buffer part is electrically coupled to the second output control part, an output end of the N+1th GOA unit, the high voltage source and the low voltage source;

the second output control part comprises:

a thirty-sixth P-type transistor, and a gate of the thirty-sixth P-type transistor is electrically coupled to the driving output end, and a source is electrically coupled to the high voltage source, and a drain is electrically coupled to a source of a thirty-ninth N-type transistor;

a thirty-seventh N-type transistor, and a gate of the thirty-seventh N-type transistor is electrically coupled to the driving output end, and a source is electrically coupled to the drain of the thirty-ninth N-type transistor, and a drain is electrically coupled to the low voltage source;

a thirty-eighth P-type transistor, and a gate of the thirty-eighth P-type transistor is electrically coupled to an M+1th sequence signal, and a source is electrically coupled to the high voltage source, and a drain is electrically coupled to the source of the thirty-ninth N-type transistor;

the thirty-ninth N-type transistor, and a gate of the thirty-ninth N-type transistor is electrically coupled to the M+1th sequence signal, and the source is electrically coupled to the drain of the thirty-sixth P-type transistor, and the drain is electrically coupled to the source of the thirty-seventh N-type transistor;

the second output buffer part comprises:

a fortieth P-type transistor, and a gate of the fortieth P-type transistor is electrically coupled to the source of the thirty-ninth N-type transistor, and a source is electrically coupled to the high voltage source, and a drain is electrically coupled to a source of a forty-first N-type transistor;

the forty-first N-type transistor, and a gate of the forty-first N-type transistor is electrically coupled to the source of the thirty-ninth N-type transistor, and the source is electrically coupled to the drain of the fortieth P-type transistor, and a drain is electrically coupled to the low voltage source;

a forty-second P-type transistor, and a gate of the forty-second P-type transistor is electrically coupled to the drain of the fortieth P-type transistor, and a source is electrically coupled to the high voltage source, and a drain is electrically coupled to a source of a forty-third N-type transistor;

the forty-third N-type transistor, and a gate of the forty-third N-type transistor is electrically coupled to the drain of the fortieth P-type transistor, and the source is electrically coupled to the drain of the forty-second P-type transistor, and a drain is electrically coupled to the low voltage source;

a forty-fourth P-type transistor, and a gate of the forty-fourth P-type transistor is electrically coupled to the drain of the forty-second P-type transistor, and a source is electrically coupled to the high voltage source, and a drain is electrically coupled to an output end of the N+1th GOA unit;

a forty-fifth N-type transistor, and a gate of the forty-fifth N-type transistor is electrically coupled to the drain of the forty-second P-type transistor, and a source is electrically coupled to the output end of the N+1th GOA unit, and a drain is electrically coupled to the low voltage source.

In the first stage connection, all the source of the first P-type transistor, the source of the second N-type transistor, the gate of the fifth P-type transistor, the gate of the seventh N-type transistor are electrically coupled to an activation signal end of the circuit.

In the last stage connection, all the source of the third P-type transistor, the source of the fourth N-type transistor, the gate of the sixth P-type transistor, the gate of the eighth N-type transistor are electrically coupled to the activation signal end of the circuit.

In the transmission part, the first P-type transistor and the second N-type transistor construct a forward transmission gate, employed to forward transmit a driving output signal of the N−1th GOA unit to the information storage part; the third P-type transistor and the fourth N-type transistor construct a backward transmission gate, employed to backward transmit a driving output signal of the N+1th GOA unit to the information storage part.

In the transmission control part, the fifth P-type transistor, the sixth P-type transistor, the seventh N-type transistor, the eighth N-type transistor, construct a NOR gate logic unit; the ninth P-type transistor, the tenth N-type transistor construct an inverter; the eleventh P-type transistor, the twelfth N-type transistor construct a transmission gate; the transmission control part is employed to control the M−2th sequence signal and transmits it to the information storage part.

In the information storage part, the fifteenth P-type transistor, the sixteenth P-type transistor, the seventeenth N-type transistor, the eighteenth N-type transistor construct a forward sequence inverter; the nineteenth P-type transistor, the twentieth P-type transistor, the twenty-first N-type transistor, the twenty-second N-type transistor construct a backward sequence inverter; the thirteenth N-type transistor, the fourteenth P-type transistor construct an inverter; the information storage part is employed to save and transmit the signals from the driving output end of the N−1th GOA unit, the driving output end of the N+1th GOA unit and the M−2th sequence signal.

The data erase part is employed to erase the voltage level of the driving output end of the circuit in due time.

In the output control part, the twenty-sixth P-type transistor, the twenty-seventh N-type transistor, the twenty-eighth P-type transistor and the twenty-ninth N-type construct a NAND gate logic unit; the twenty-fourth P-type transistor, twenty-fifth N-type transistor construct an inverter; the output control part is employed to control a scan signal outputted by the output end to output the scan signal according with time sequence.

In the output buffer part, the thirtieth P-type transistor and the thirty-first N-type transistor, the thirty-second P-type transistor and the thirty-third N-type transistor, the thirty-fourth P-type transistor and thirty-fifth N-type transistor respectively construct three inverters, employed to adjust the scan signal with a done sequence adjustment, and meanwhile, to strengthen a band loading capacity.

In the second output control part, the thirty-sixth P-type transistor, the thirty-seventh N-type transistor, the thirty-eighth P-type transistor, the thirty-ninth N-type transistor construct a NAND gate logic unit, employed to control the scan signal outputted by the output end of the N+1th GOA unit to output the scan signal according with time sequence; in the second output buffer part, the fortieth P-type transistor and the forty-first N-type transistor, the forty-second P-type transistor and the forty-third N-type transistor, the forty-fourth P-type transistor and the forty-fifth N-type transistor respectively construct three inverters, employed to adjust the scan signal with a done sequence adjustment, and meanwhile, to strengthen a band loading capacity; the second output control part and the second output buffer part output a scan signal of the latter stage from the output end of the N+1th GOA unit according to the outputted signal of the driving output end and the M+1th sequence signal to realize that the single stage GOA unit controls two stage circuits forward-backward bidirectional scan output.

The sequence signal comprises four sets of sequence signals: a first sequence signal, a second sequence signal, a third sequence signal, a fourth sequence signal, and the M−2th sequence signal is the third sequence signal when the sequence signal is the first sequence signal, and the M−2th sequence signal is the fourth sequence signal when the sequence signal is the second sequence signal, and the M+1th sequence signal is the first sequence signal when the sequence signal is the fourth sequence signal.

The benefits of the present invention are: the present invention provides the GOA circuit of LTPS semiconductor TFT, employed for forward-backward bidirectional scan transmission. The Nth GOA unit utilizes a plurality of N-type transistors and a plurality of P-type transistors, comprising a transmission part, a transmission control part, an information storage part, a data erase part, an output control part and an output buffer part. The transmission part comprises the transmission gate; the transmission control part comprises the NOR gate logic unit, the inverter and the transmission gate; the information storage part comprises the sequence inverter, the inverter; the output control part comprises the NAND gate logic unit, the inverter; the output buffer part comprises the inverter; the transmission gate is employed to perform the former-latter level transferring signal, and the NOR gate logic unit and the NAND gate logic unit are employed to convert the signals, and the sequence inverter and the inverter are employed to save and transmit the signals to solve the issues that the stability of the circuit is poor, and the power consumption is larger as concerning the LTPS with single type TFT elements, and the problem of TFT leakage of the single type GOA circuit to optimize the performance of the circuit; by setting the second output control part and the second output buffer part to realize sharing the driving output end to make the single stage GOA unit control two stage circuits forward-backward bidirectional scan output, the amount of the TFTs can be reduced to realize the ultra narrow frame or frameless designs.

BRIEF DESCRIPTION OF THE DRAWINGS

For better explaining the technical solution and the effect of the present invention, the present invention will be further described in detail with the accompanying drawings in the specific embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
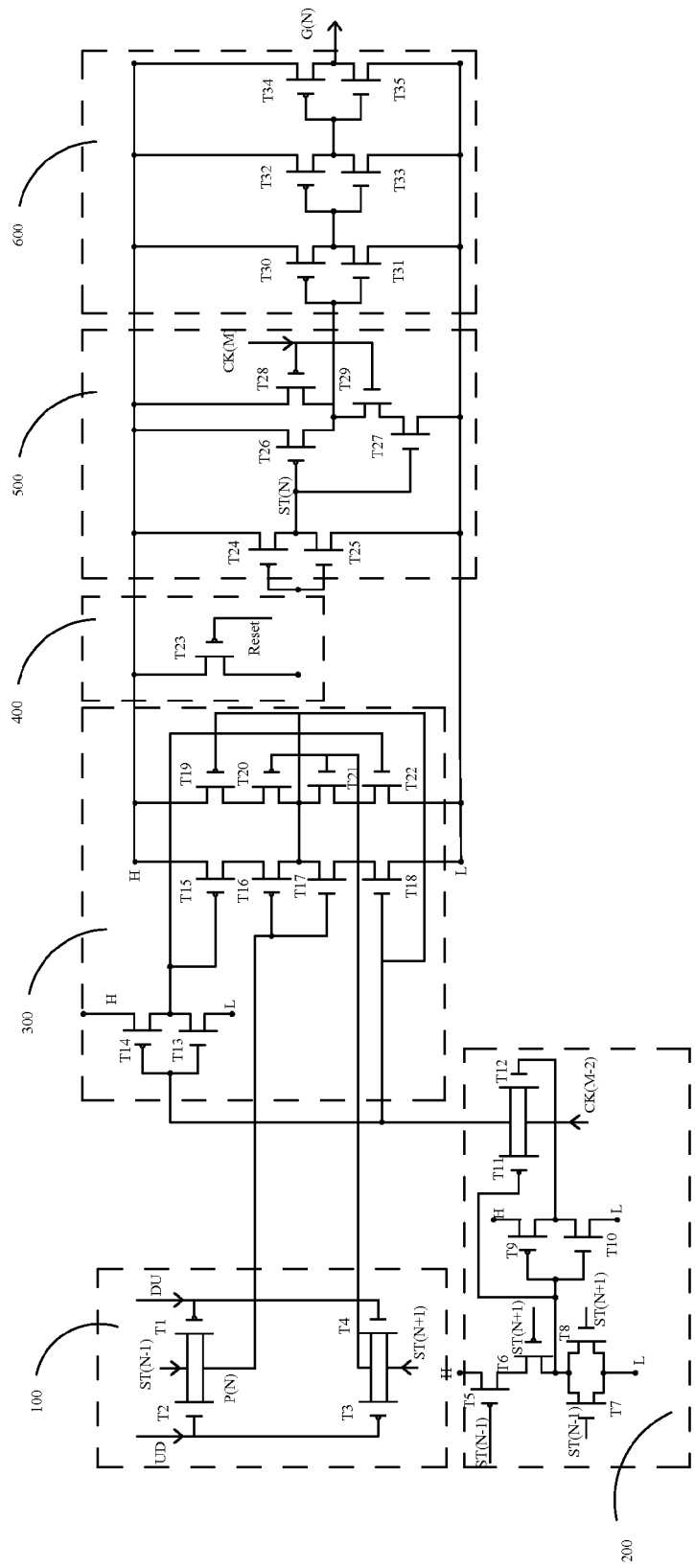
FIG. 1 is a circuit diagram of a GOA circuit of LTPS semiconductor TFT according to the first embodiment of the present invention.

Please refer to FIG. 1, which is a circuit diagram of a GOA circuit of LTPS semiconductor TFT according to the first embodiment of the present invention. As shown in FIG. 1, the GOA circuit of LTPS semiconductor TFT, employed for forward-backward bidirectional scan transmission comprises a plurality of GOA units which are cascade connected, and N is set to be a positive integer and an Nth GOA unit utilizes a plurality of N-type transistors and a plurality of P-type transistors and comprises a transmission part 100, a transmission control part 200, an information storage part 300, a data erase part 400, an output control part 500 and an output buffer part 600;

the transmission part 100 is electrically coupled to a first low frequency signal UD, a second low frequency signal DU, a driving output end ST(N−1) of an N−1th GOA unit which is the former stage of the Nth GOA unit, a driving output end ST(N+1) of an N+1th GOA unit which is the latter stage of the Nth GOA unit and the information storage part 300; the transmission control part 200 is electrically coupled to a driving output end ST(N+1) of an N+1th GOA unit which is the latter stage of the Nth GOA unit, the driving output end ST(N−1) of the N−1th GOA unit which is the former stage of the Nth GOA unit, an M−2th sequence signal CK(M−2) a high voltage source H, a low voltage source L and the information storage part 300; the information storage part 300 is electrically coupled to the transmission part 100, the transmission control part 200, the data erase part 400, the high voltage source H and the low voltage source L; the data erase part 400 is electrically coupled to the information storage part 300, the output control part 500, the high voltage source H and the reset signal end Reset; the output control part 500 is electrically coupled to the data erase part 400, the output buffer part 600, a driving output end ST(N), a sequence signal CK(M), the high voltage source H and the low voltage source L; the output buffer part 600 is electrically coupled to the output control part 500, an output end G(N), the high voltage source H and the low voltage source L;

voltage levels of the first low frequency signal UD and the second low frequency signal DU are switched along with the forward-backward scan, and the first low frequency signal UD is equivalent to a direct current high voltage level, and the second low frequency signal DU is equivalent to a direct current low voltage level as forward scan; the first low frequency signal UD is equivalent to a direct current low voltage level, and the second low frequency signal DU is equivalent to a direct current high voltage level as backward scan;

the transmission part comprises 100 a first P-type transistor T1, and a gate of the first P-type transistor T1 is electrically coupled to the second low frequency signal DU, and a source is electrically coupled to the driving output end ST(N−1) of the N−1th GOA unit which is the former stage of the Nth GOA unit, and a drain is electrically coupled to a first node P(N); a second N-type transistor T2, and a gate of the second N-type transistor T2 is electrically coupled to the first low frequency signal UD, and a source is electrically coupled to the driving output end ST(N−1) of the N−1th GOA unit which is the former stage of the Nth GOA unit, and a drain is electrically coupled to the first node P(N); a third P-type transistor T3, and a gate of the third P-type transistor T3 is electrically coupled to the first low frequency signal UD, and a source is electrically coupled to the driving output end ST(N+1) of the N+1th GOA unit which is the latter stage of the Nth GOA unit, and a drain is electrically coupled to a second node Q(N); a fourth N-type transistor T4, and a gate of the fourth N-type transistor T4 is electrically coupled to the second low frequency signal DU, and a source is electrically coupled to the driving output end ST(N+1) of the N+1th GOA unit which is the latter stage of the Nth GOA unit, and a drain is electrically coupled to the second node Q(N).

The first P-type transistor T1 and the second N-type transistor T2 construct a forward transmission gate, and when the first low frequency signal UD is equivalent to a direct current high voltage level, and the second low frequency signal DU is equivalent to a direct current low voltage level as forward scan, the forward transmission gate functions to be employed to forward transmit a driving output signal ST(N−1) of the N−1th GOA unit to the information storage part 300; the third P-type transistor and the fourth N-type transistor construct a backward transmission gate, and when the first low frequency signal UD is equivalent to a direct current low voltage level, and the second low frequency signal DU is equivalent to a direct current high voltage level as backward scan, the backward transmission gate functions to be employed to backward transmit a driving output signal ST(N+1) of the N+1th GOA unit to the information storage part 300.

The transmission control part 200 comprises: a fifth P-type transistor T5, and a gate of the fifth P-type transistor T5 is electrically coupled to the driving output end ST(N−1) of the N−1th GOA unit which is the former stage of the Nth GOA unit, and the source is electrically coupled to the high voltage source H, and a drain is electrically coupled to a source of a sixth P-type transistor T6; the sixth P-type transistor T6, and a gate of the sixth P-type transistor T6 is electrically coupled to the driving output end ST(N+1) of the N−1th GOA unit which is the latter stage of the Nth GOA unit, and a source is electrically coupled to the drain of the fifth P-type transistor T5, and a drain is electrically coupled to a source of a seventh N-type transistor T7; the seventh N-type transistor T7, and a gate of the seventh N-type transistor T7 is electrically coupled to the driving output end ST(N−1) of the N−1th GOA unit which is the former stage of the Nth GOA unit, and a source is electrically coupled to the drain of the sixth P-type transistor T6, and a drain is electrically coupled to the low voltage source L; an eighth N-type transistor T8, and the gate of the eighth N-type transistor T8 is electrically coupled to the driving output end ST(N+1) of the N+1th GOA unit which is the latter stage of the Nth GOA unit, and the source is electrically coupled to the drain of the sixth P-type transistor T6, and a drain is electrically coupled to the low voltage source L; a ninth P-type transistor T9, and a gate of the ninth P-type transistor T9 is electrically coupled to the drain of the sixth P-type transistor T6, and a source is electrically coupled to the high voltage source H, and a drain is electrically coupled to a source of a tenth N-type transistor T10; the tenth N-type transistor T10, and a gate of the tenth N-type transistor T10 is electrically coupled to the drain of the sixth P-type transistor T6, and the source is electrically coupled to the drain of the ninth P-type transistor T9, and a drain is electrically coupled to the low voltage source L; an eleventh P-type transistor T11, a gate of the eleventh P-type transistor T11 is electrically coupled to the drain of the sixth P-type transistor T6, and a source is electrically coupled to a source of a twelfth N-type transistor T12, and a drain is electrically coupled to the M−2th sequence signal CK(M−2); the twelfth N-type transistor T12, and a gate of the twelfth N-type transistor T12 is electrically coupled to the drain of the ninth P-type transistor T9, and the source is electrically coupled to the source of the eleventh P-type transistor T11, and a drain is electrically coupled to the M−2th sequence signal CK(M−2);

the fifth P-type transistor T5, the sixth P-type transistor T6, the seventh N-type transistor T7, the eighth N-type transistor T8, construct a NOR gate logic unit; the ninth P-type transistor T9, the tenth N-type transistor T10 construct an inverter; the eleventh P-type transistor T11, the twelfth N-type transistor T12 construct a transmission gate; the transmission control part 200 is employed to control the M−2th sequence signal CK(M−2) and transmits it to the information storage part 300.

The information storage part 300 comprises a thirteenth N-type transistor T13, and a gate of the thirteenth N-type transistor T13 is electrically coupled to the source of the eleventh P-type transistor T11, and a source is electrically coupled to a drain of a fourteenth P-type transistor T14, and a drain is electrically coupled to the low voltage source L; the fourteenth P-type transistor T14, and a gate of the fourteenth P-type transistor T14 is electrically coupled to the source of the eleventh P-type transistor T11, and a source is electrically coupled to the high voltage source H, and the drain is electrically coupled to the source of the thirteenth N-type transistor T13; a fifteenth P-type transistor T15, and a gate of the fifteenth P-type transistor T15 is electrically coupled to the source of the thirteenth N-type transistor T13, and a source is electrically coupled to the high voltage source H, and a drain is electrically coupled to a source of a sixteenth P-type transistor T16; the sixteenth P-type transistor T16, and a gate of the sixteenth P-type transistor T16 is electrically coupled to the first node P(N), and the source is electrically coupled to the drain of the fifteenth P-type transistor T15, and a drain is electrically coupled to a source of a seventeenth N-type transistor T17; the seventeenth N-type transistor T17, and a gate of the sixteenth P-type transistor T17 is electrically coupled to the first node P(N), and the source is electrically coupled to the drain of the sixteenth P-type transistor T16, and a drain is electrically coupled to a source of an eighteenth N-type transistor T18; the eighteenth N-type transistor T18, and a gate of the sixteenth P-type transistor T18 is electrically coupled to the source of the eleventh P-type transistor T11, and the source is electrically coupled to the drain of the seventeenth N-type transistor T17, and a drain is electrically coupled to the low voltage source L; a nineteenth P-type transistor T19, and a gate of the nineteenth P-type transistor T19 is electrically coupled to the gate of the thirteenth N-type transistor T13, and a source is electrically coupled to the high voltage source H, and a drain is electrically coupled to a source of a twentieth P-type transistor T20; the twentieth P-type transistor T20, and a gate of the twentieth P-type transistor T20 is electrically coupled to the first node Q(N), and the source is electrically coupled to the drain of the nineteenth P-type transistor T19, and a drain is electrically coupled to a source of a twenty-first N-type transistor T21; the twenty-first N-type transistor T21, and a gate of the twenty-first N-type transistor T21 is electrically coupled to the first node Q(N), and the source is electrically coupled to the drain of the twentieth P-type transistor T20, and a drain is electrically coupled to a source of a twenty-second N-type transistor T22; the twenty-second N-type transistor T22, and a gate of the twenty-second N-type transistor T22 is electrically coupled to the source of the thirteenth N-type transistor T13, and the source is electrically coupled to the drain of the twenty-first N-type transistor T21, and a drain is electrically coupled to the low voltage source L;

the fifteenth P-type transistor T15, the sixteenth P-type transistor T16, the seventeenth N-type transistor T17, the eighteenth N-type transistor T18 construct a forward sequence inverter, and the forward sequence inverter is electrically coupled to the forward transmission gate in the transmission part 100; the nineteenth P-type transistor, the twentieth P-type transistor, the twenty-first N-type transistor, the twenty-second N-type transistor construct a backward sequence inverter, and the backward sequence inverter is electrically coupled to the backward transmission gate in the transmission part 100; the thirteenth N-type transistor T13, the fourteenth P-type transistor T14 construct an inverter; as forward scan, the information storage part 300 is employed to save and transmit the signals from the driving output end ST(N−1) of the N−1th GOA unit and the M−2th sequence signal CK(M−2); as backward scan, the information storage part 300 is employed to save and transmit the signals from the driving output end ST(N+1) of the N+1th GOA unit and the M−2th sequence signal CK(M−2).

The data erase part 400 comprises a twenty-third P-type transistor T23, and a gate of the twenty-third P-type transistor T23 is electrically coupled to the reset signal end Reset, and a source is electrically coupled to the high voltage source H, and a drain is electrically coupled to the drain of the sixteenth P-type transistor T16 and the drain of the twentieth P-type transistor T20; the data erase part 400 is employed to erase the voltage level of the driving output end ST(N) of the circuit in due time. Mainly, the reset signal end Reset receives a pulse reset signal to discharge the driving output end ST(N), and accordingly to erase the voltage level of the driving output end ST(N) at the start of the every frame.

the output control part 500 comprises a twenty-fourth P-type transistor T24, and a gate of the twenty-fourth P-type transistor T24 is electrically coupled to the drain of the sixteenth P-type transistor T16 and the drain of the twentieth P-type transistor T20, and a source is electrically coupled to the high voltage source H, and a drain is electrically coupled to the driving output end ST(N); a twenty-fifth N-type transistor T25, and a gate of the twenty-fifth N-type transistor T25 is electrically coupled to the drain of the sixteenth P-type transistor T16 and the drain of the twentieth P-type transistor T20, and a source is electrically coupled to the driving output end ST(N), and a drain is electrically coupled to the low voltage source L; a twenty-sixth P-type transistor T26, and a gate of the twenty-sixth P-type transistor T26 is electrically coupled to the driving output end ST(N), and a source is electrically coupled to the high voltage source H, and a drain is electrically coupled to a source of a twenty-ninth N-type transistor T29; a twenty-seventh N-type transistor T27, and a gate of the twenty-seventh N-type transistor T27 is electrically coupled to the driving output end ST(N), and a source is electrically coupled to a drain of the twenty-ninth N-type transistor T29, and a drain is electrically coupled to the low voltage source L; a twenty-eighth P-type transistor T28, and a gate of the sixteenth P-type transistor is electrically coupled to the sequence signal CK(M), and a source is electrically coupled to the high voltage source H, and a drain is electrically coupled to the source of the twenty-ninth N-type transistor T29; the twenty-ninth N-type transistor T29, and a gate of the twenty-ninth N-type transistor T29 is electrically coupled to the sequence signal CK(M), and the source is electrically coupled to the drain of twenty-sixth P-type transistor T26, and a drain is electrically coupled to the source of the twenty-seventh N-type transistor T27;

the twenty-sixth P-type transistor T26, the twenty-seventh N-type transistor T27, the twenty-eighth P-type transistor T28 and the twenty-ninth N-type T29 construct a NAND gate logic unit; the twenty-fourth P-type transistor T24, twenty-fifth N-type transistor T25 construct an inverter; the output control part 500 is employed to control a scan signal outputted by the output end G(N) to output the scan signal according with time sequence.

The output buffer part 600 comprises a thirtieth P-type transistor T30, and a gate of the thirtieth P-type transistor T30 is electrically coupled to the source of the twenty-ninth N-type transistor T29, and a source is electrically coupled to the high voltage source H, and a drain is electrically coupled to a source of a thirty-first N-type transistor T31; the thirty-first N-type transistor T31, and a gate of the thirty-first N-type transistor T31 is electrically coupled to the source of the twenty-ninth N-type transistor T29, and the source is electrically coupled to the drain of the thirtieth P-type transistor T30, and a drain is electrically coupled to the low voltage source L; a thirty-second P-type transistor T32, and a gate of the thirty-second P-type transistor T32 is electrically coupled to the drain of the thirtieth P-type transistor T30, and a source is electrically coupled to the high voltage source H, and a drain is electrically coupled to a source of a thirty-third N-type transistor T33; the thirty-third N-type transistor T33, and a gate of the thirty-third N-type transistor T33 is electrically coupled to the drain of the thirtieth P-type transistor T30, and the source is electrically coupled to the drain of the thirty-second P-type transistor T32, and a drain is electrically coupled to the low voltage source L; a thirty-fourth P-type transistor T34, and a gate of the thirty-fourth P-type transistor T34 is electrically coupled to the drain of the thirty-second P-type transistor T32, and a source is electrically coupled to the high voltage source H, and a drain is electrically coupled to the output end G(N); a thirty-fifth N-type transistor T35, and a gate of the thirty-fifth N-type transistor T35 is electrically coupled to the drain of the thirty-second P-type transistor T32, and a source is electrically coupled to the output end G(N), and a drain is electrically coupled to the low voltage source L.

The thirtieth P-type transistor T30 and the thirty-first N-type transistor T31, the thirty-second P-type transistor T32 and the thirty-third N-type transistor T33, the thirty-fourth P-type transistor T34 and thirty-fifth N-type transistor T35 respectively construct three inverters, employed to adjust the scan signal with a done sequence adjustment, and meanwhile, to strengthen a band loading capacity.

Figure 2:
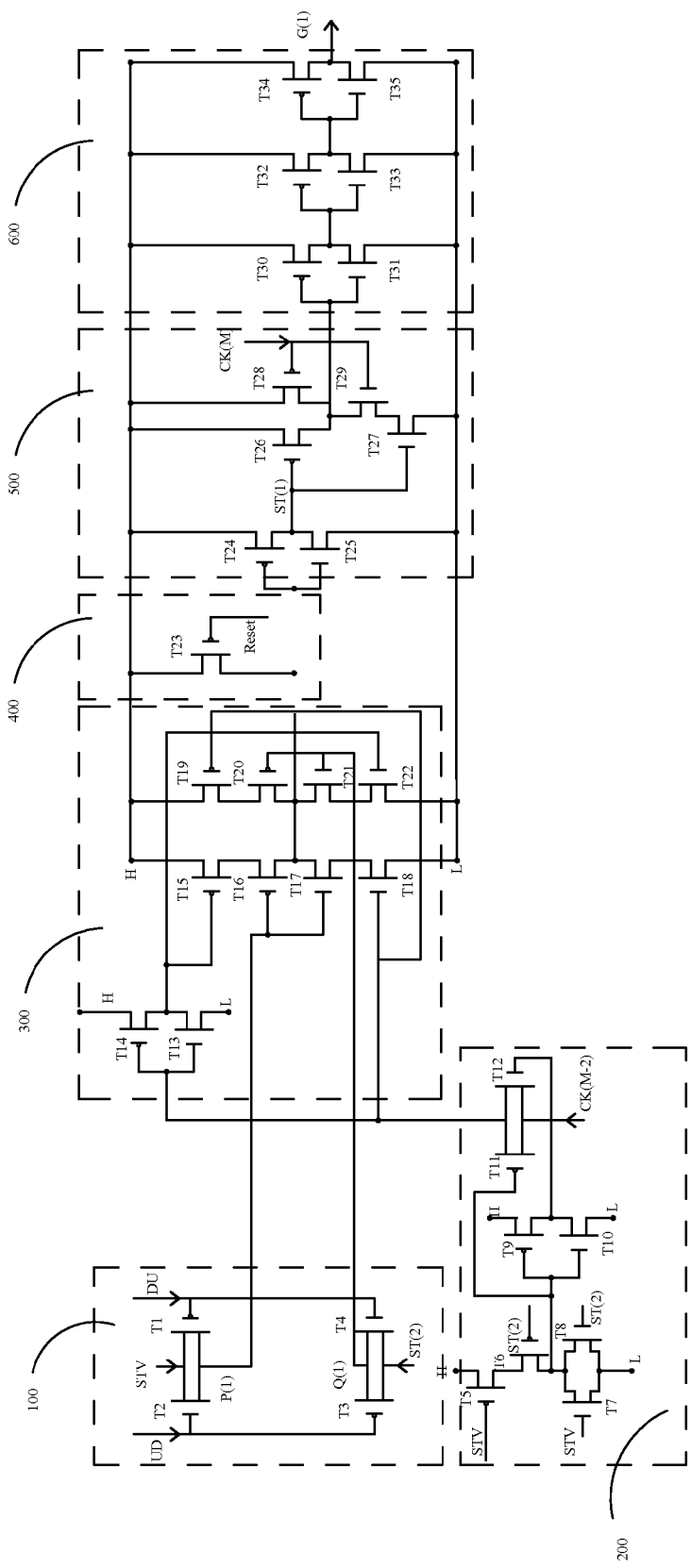
FIG. 2 is a circuit diagram of the first stage connection of the GOA circuit of LTPS semiconductor TFT according to the first embodiment of the present invention.
Figure 3:
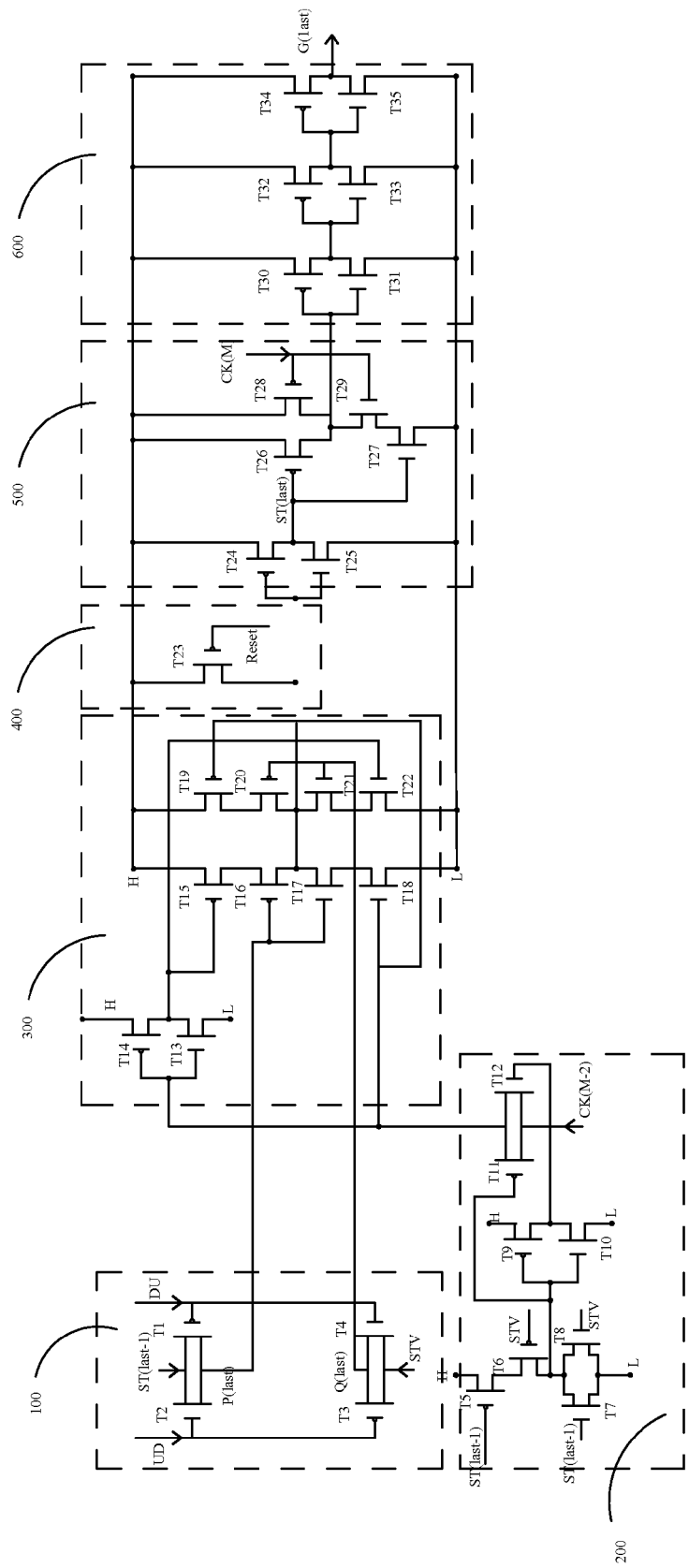
FIG. 3 is a circuit diagram of the last stage connection of the GOA circuit of LTPS semiconductor TFT according to the first embodiment of the present invention.

As shown in FIGS. 2-3, in the first stage connection of the GOA circuit of LTPS semiconductor TFT, all the source of the first P-type transistor T1, the source of the second N-type transistor T2, the gate of the fifth P-type transistor T5, the gate of the seventh N-type transistor T7 are electrically coupled to an activation signal end STV of the circuit; in the last stage connection, all the source of the third P-type transistor T3, the source of the fourth N-type transistor T4, the gate of the sixth P-type transistor T6, the gate of the eighth N-type transistor T8 are electrically coupled to the activation signal end STV of the circuit.

Figure 5:
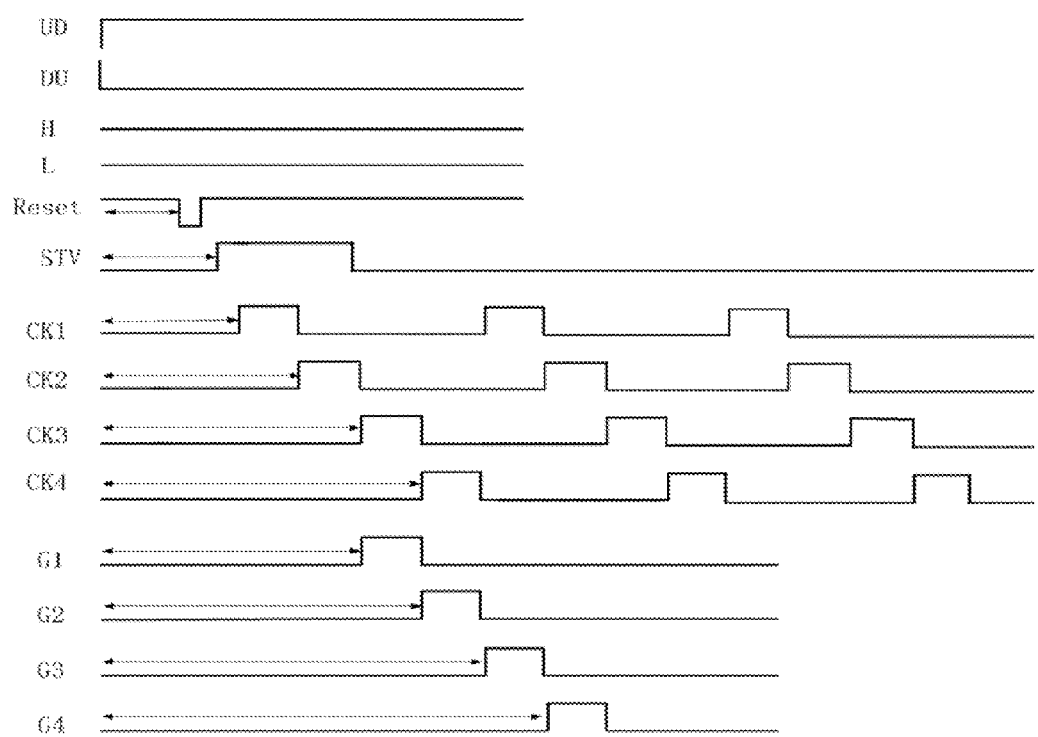
FIG. 5 is a waveform diagram of the key nodes in the GOA circuit of LTPS semiconductor TFT as forward scan according to the present invention.
Figure 6:
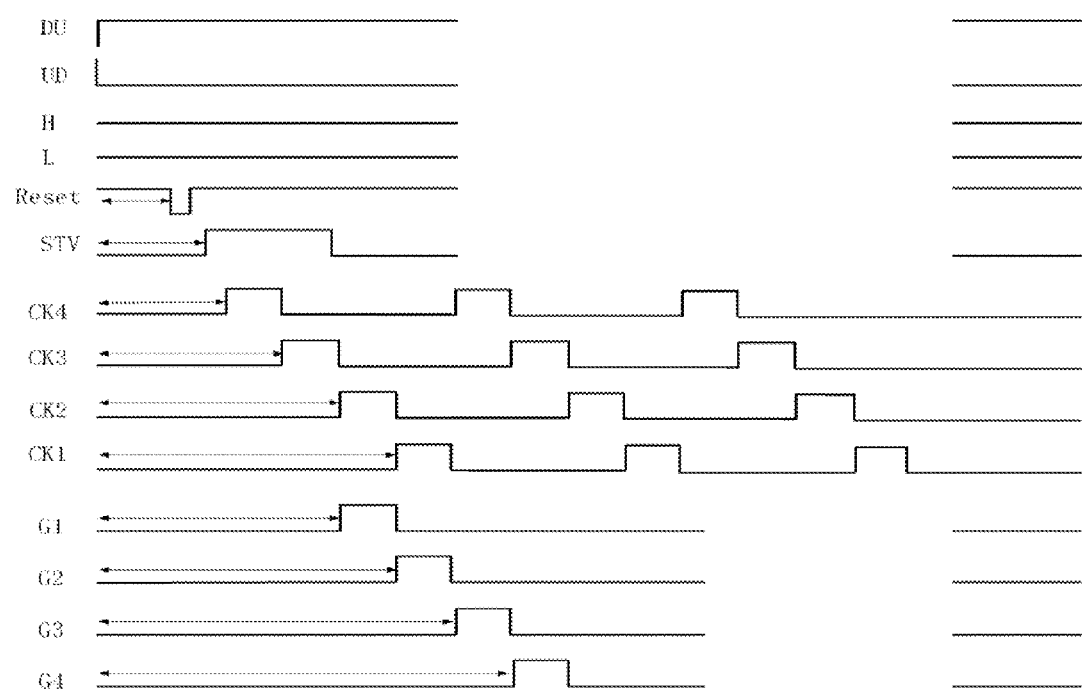
FIG. 6 is a waveform diagram of the key nodes in the GOA circuit of LTPS semiconductor TFT as backward scan according to the present invention.

Please refer to FIGS. 5-6, which respectively are waveform diagrams of the key nodes in the GOA circuit of LTPS semiconductor TFT as forward scan, backward scan according to the present invention. AS shown in FIG. 5, FIG. 6, the first low frequency signal UD and the second low frequency signal DU are low frequency signals which the voltage levels can be switched along with the forward-backward scan, and the first low frequency signal UD is equivalent to a direct current high voltage level, and the second low frequency signal DU is equivalent to a direct current low voltage level as forward scan, and the first low frequency signal UD is equivalent to a direct current low voltage level, and the second low frequency signal DU is equivalent to a direct current high voltage level as backward scan; the order of the clock signal CK(M) has differences as forward-backward scan; the high voltage source H and the low voltage source L are inputted constant voltage control signals; the signal from the reset signal end Reset is a pulse signal which mainly discharges the key notes of the circuit at the start of the every frame; STV signal is the activation signal for the entire GOA circuit, and the circuit portion utilizes forward-backward bidirectional connection to realize the forward-backward bidirectional activation.

Please refer to FIG. 5, the waveforms of the respective key nodes satisfy the demands of design. The first low frequency signal UD and the second low frequency signal DU are equivalent to direct current high and low voltage levels as forward scan; the sequence signal CK(M) comprises four sets of sequence signals, which respectively are a first sequence signal CK(1), a second sequence signal CK(2), a third sequence signal CK(3), a fourth sequence signal CK(4), and the M−2th sequence signal CK(M−2) is the third sequence signal CK(3) when the sequence signal CK(M) is the first sequence signal CK(1), and the M−2th sequence signal CK(M−2) is the fourth sequence signal CK(4) when the sequence signal CK(M) is the second sequence signal CK(2), and the M+1th sequence signal CK(M+1) is the first sequence signal CK(1) when the sequence signal CK(M) is the fourth sequence signal CK(4). The pulse signals of the sequence signal CK(M) arrive in sequence of CK(1)-CK(4). The third sequence signal CK(3) corresponds to the output signal of the first stage output end G(1). The fourth sequence signal CK(4) corresponds to the output signal of the second stage output end G(2), and the first sequence signal CK(1) corresponds to the output signal of the third stage output end G(3), and the second sequence signal CK(2) corresponds to the output signal of the fourth stage output end G(4), and so on.

Please refer to FIG. 6, the waveforms of the respective key nodes satisfy the demands of design. The first low frequency signal UD and the second low frequency signal DU are equivalent to direct current low and high voltage levels as backward scan, and the pulse signals of the sequence signal CK(M) arrive in sequence of CK(4)-CK(1). The second sequence signal CK(2) corresponds to the output signal of the first stage output end G(1). The first sequence signal CK(1) corresponds to the output signal of the second stage output end G(2), and the fourth sequence signal CK(4) corresponds to the output signal of the third stage output end G(3), and the third sequence signal CK(3) corresponds to the output signal of the fourth stage output end G(4), and so on.

Figure 4:
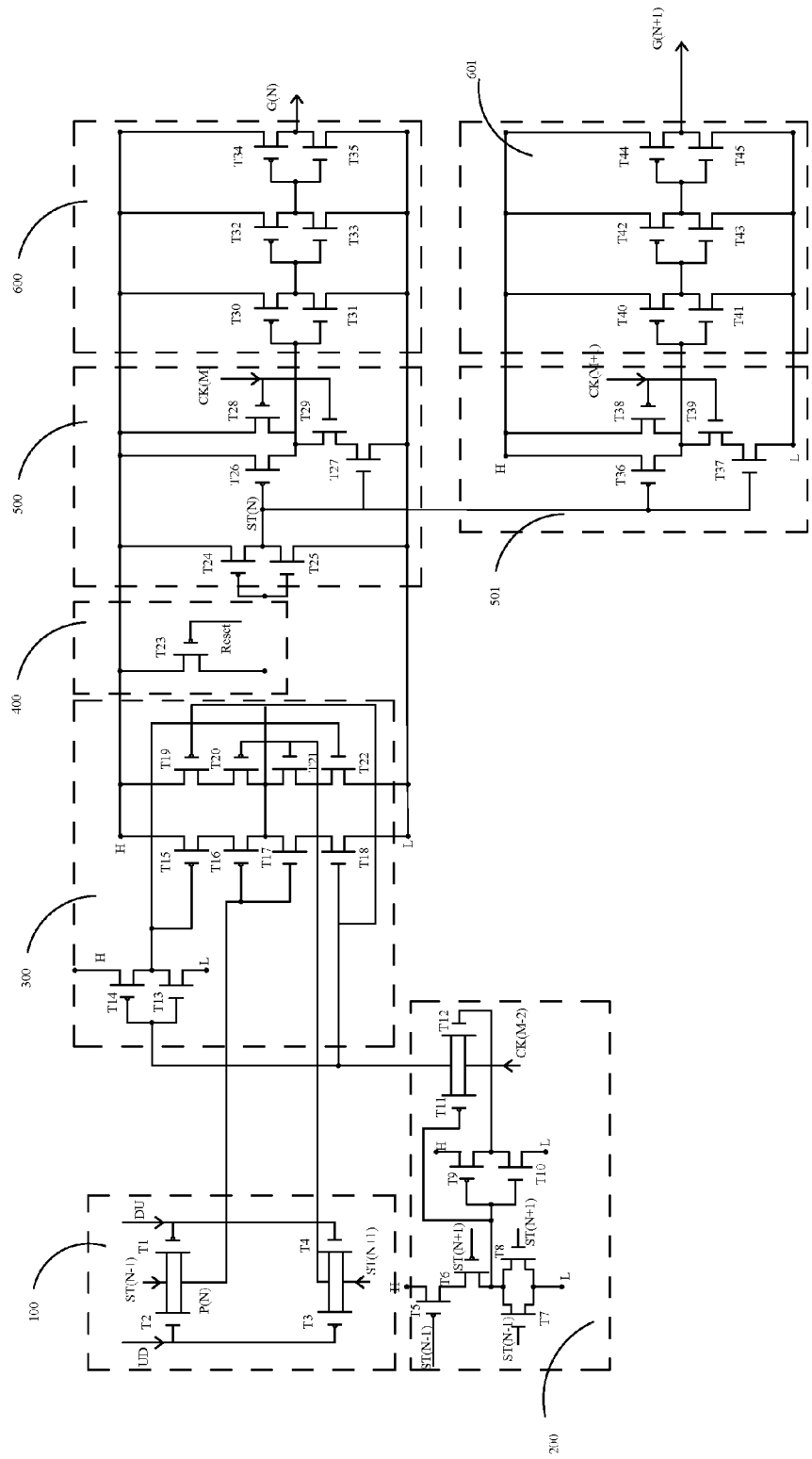
FIG. 4 is a circuit diagram of a GOA circuit of LTPS semiconductor TFT according to the second embodiment of the present invention.

Please refer to FIG. 4, which is a circuit diagram of a GOA circuit of LTPS semiconductor TFT according to the second embodiment of the present invention. As shown in FIG. 4, the difference of the second embodiment from the first embodiment is, the GOA circuit further comprises a second output control part 501, a second output buffer part 601. The second output control part 501 is electrically coupled to the output control part 500, the driving output end ST(N), an M+1th sequence signal CK(M+1), the high voltage source H and the low voltage source L; the second output buffer part 601 is electrically coupled to the second output control part 501, an output end G(N+1) of the N+1th GOA unit, the high voltage source H and the low voltage source L.

the second output control part 501 comprises a thirty-sixth P-type transistor T36, and a gate of the thirty-sixth P-type transistor T36 is electrically coupled to the driving output end ST(N), and a source is electrically coupled to the high voltage source H, and a drain is electrically coupled to a source of a thirty-ninth N-type transistor T39; a thirty-seventh N-type transistor T37, and a gate of the thirty-seventh N-type transistor T37 is electrically coupled to the driving output end ST(N), and a source is electrically coupled to the drain of the thirty-ninth N-type transistor T39, and a drain is electrically coupled to the low voltage source L; a thirty-eighth P-type transistor T38, and a gate of the thirty-eighth P-type transistor T38 is electrically coupled to an M+1th sequence signal CK(M+1), and a source is electrically coupled to the high voltage source H, and a drain is electrically coupled to the source of the thirty-ninth N-type transistor T39; the thirty-ninth N-type transistor T39, and a gate of the thirty-ninth N-type transistor T39 is electrically coupled to the M+1th sequence signal CK(M+1), and the source is electrically coupled to the drain of the thirty-sixth P-type transistor T36, and the drain is electrically coupled to the source of the thirty-seventh N-type transistor T37;

the second output buffer part 601 comprises a fortieth P-type transistor T40, and a gate of the fortieth P-type transistor T40 is electrically coupled to the source of the thirty-ninth N-type transistor T39, and a source is electrically coupled to the high voltage source H, and a drain is electrically coupled to a source of a forty-first N-type transistor T41; the forty-first N-type transistor T41, and a gate of the forty-first N-type transistor T41 is electrically coupled to the source of the thirty-ninth N-type transistor T39, and the source is electrically coupled to the drain of the fortieth P-type transistor T40, and a drain is electrically coupled to the low voltage source L; a forty-second P-type transistor T42, and a gate of the forty-second P-type transistor T42 is electrically coupled to the drain of the fortieth P-type transistor T40, and a source is electrically coupled to the high voltage source H, and a drain is electrically coupled to a source of a forty-third N-type transistor T43; the forty-third N-type transistor T43, and a gate of the forty-third N-type transistor T43 is electrically coupled to the drain of the fortieth P-type transistor T40, and the source is electrically coupled to the drain of the forty-second P-type transistor T42, and a drain is electrically coupled to the low voltage source L; a forty-fourth P-type transistor T44, and a gate of the forty-fourth P-type transistor T44 is electrically coupled to the drain of the forty-second P-type transistor T42, and a source is electrically coupled to the high voltage source H, and a drain is electrically coupled to an output end G(N+1) of the N+1th GOA unit; a forty-fifth N-type transistor T45, and a gate of the forty-fifth N-type transistor T45 is electrically coupled to the drain of the forty-second P-type transistor T42, and a source is electrically coupled to the output end G(N+1) of the N+1th GOA unit, and a drain is electrically coupled to the low voltage source L.

In the second output control part 501, the thirty-sixth P-type transistor T36, the thirty-seventh N-type transistor T37, the thirty-eighth P-type transistor T38, the thirty-ninth N-type transistor T39 construct a NAND gate logic unit, employed to control the scan signal outputted by the output end G(N+1) of the N+1th GOA unit to output the scan signal according with time sequence; in the second output buffer part 601, the fortieth P-type transistor T40 and the forty-first N-type transistor T41, the forty-second P-type transistor T42 and the forty-third N-type transistor T43, the forty-fourth P-type transistor T44 and the forty-fifth N-type transistor T45 respectively construct three inverters, employed to adjust the scan signal with a done sequence adjustment, and meanwhile, to strengthen a band loading capacity; the second output control part 501 and the second output buffer part 601 output a scan signal of the latter stage from the output end G(N+1) of the N+1th GOA unit according to the outputted signal of the driving output end ST(N) and the M+1th sequence signal CK(M+1) to realize that the single stage GOA unit controls two stage circuits forward-backward bidirectional scan output.

By adding the second output control part 501, the second output buffer part 601, the effect that the single stage GOA unit controls two stage circuits forward-backward bidirectional scan output can be realized. Meanwhile, the second output control part 501 and the second output buffer part 601 share one driving output end ST(N). The amount of the TFTs can be reduced and realize the ultra narrow frame or frameless designs by sharing the driving output end ST(N).

In conclusion, the GOA circuit of LTPS semiconductor TFT according to the present invention is employed for forward-backward bidirectional scan transmission. The Nth GOA unit utilizes a plurality of N-type transistors and a plurality of P-type transistors, comprising a transmission part, a transmission control part, an information storage part, a data erase part, an output control part and an output buffer part. The transmission part comprises the transmission gate; the transmission control part comprises the NOR gate logic unit, the inverter and the transmission gate; the information storage part comprises the sequence inverter, the inverter; the output control part comprises the NAND gate logic unit, the inverter; the output buffer part comprises the inverter; the transmission gate is employed to perform the former-latter level transferring signal, and the NOR gate logic unit and the NAND gate logic unit are employed to convert the signals, and the sequence inverter and the inverter are employed to save and transmit the signals to solve the issues that the stability of the circuit is poor, and the power consumption is larger as concerning the LTPS with single type TFT elements, and the problem of TFT leakage of the single type GOA circuit to optimize the performance of the circuit; by setting the second output control part and the second output buffer part to realize sharing the driving output end to make the single stage GOA unit control two stage circuits forward-backward bidirectional scan output, the amount of the TFTs can be reduced to realize the ultra narrow frame or frameless designs.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit of LTPS semiconductor TFT, employed for forward-backward bidirectional scan transmission, comprising a plurality of GOA units which are cascade connected, and N is set to be a positive integer and an Nth GOA unit utilizes a plurality of N-type transistors and a plurality of P-type transistors and comprises a transmission part, a transmission control part, an information storage part, a data erase part, an output control part and an output buffer part;

the transmission part is electrically coupled to a first low frequency signal, a second low frequency signal, a driving output end of an N−1th GOA unit which is the former stage of the Nth GOA unit, a driving output end of an N+1th GOA unit which is the latter stage of the Nth GOA unit and the information storage part; the transmission control part is electrically coupled to the driving output end of the N+1th GOA unit which is the latter stage of the Nth GOA unit, the driving output end of the N−1th GOA unit which is the former stage of the Nth GOA unit, an M-2th sequence signal, a high voltage source, a low voltage source and the information storage part; the information storage part is electrically coupled to the transmission part, the transmission control part, the data erase part, the high voltage source and the low voltage source; the data erase part is electrically coupled to the information storage part, the output control part, the high voltage source and the reset signal end; the output control part is electrically coupled to the data erase part, the output buffer part, a driving output end, a sequence signal, the high voltage source and the low voltage source; the output buffer part is electrically coupled to the output control part, an output end, the high voltage source and the low voltage source;

voltage levels of the first low frequency signal and the second low frequency signal are switched along with the forward-backward scan, and the first low frequency signal is equivalent to a direct current high voltage level, and the second low frequency signal is equivalent to a direct current low voltage level as forward scan; the first low frequency signal is equivalent to a direct current low voltage level, and the second low frequency signal is equivalent to a direct current high voltage level as backward scan;

the transmission part comprises a first P-type transistor, and a gate of the first P-type transistor is electrically coupled to the second low frequency signal, and a source is electrically coupled to the driving output end of the N−1th GOA unit which is the former stage of the Nth GOA unit, and a drain is electrically coupled to a first node; a second N-type transistor, and a gate of the second N-type transistor is electrically coupled to the first low frequency signal, and a source is electrically coupled to the driving output end of the N−1th GOA unit which is the former stage of the Nth GOA unit, and a drain is electrically coupled to the first node; a third P-type transistor, and a gate of the third P-type transistor is electrically coupled to the first low frequency signal, and a source is electrically coupled to the driving output end of the N+1th GOA unit which is the latter stage of the Nth GOA unit, and a drain is electrically coupled to a second node; a fourth N-type transistor, and a gate of the fourth N-type transistor is electrically coupled to the second low frequency signal, and a source is electrically coupled to the driving output end of the N+1th GOA unit which is the latter stage of the Nth GOA unit, and a drain is electrically coupled to the second node;

the transmission control part comprises:

a fifth P-type transistor, and a gate of the fifth P-type transistor is electrically coupled to the driving output end of the N−1th GOA unit which is the former stage of the Nth GOA unit, and the source is electrically coupled to the high voltage source, and a drain is electrically coupled to a source of a sixth P-type transistor;

the sixth P-type transistor, and a gate of the sixth P-type transistor is electrically coupled to the driving output end of the N+1th GOA unit which is the latter stage of the Nth GOA unit, and a source is electrically coupled to the drain of the fifth P-type transistor, and a drain is electrically coupled to a source of a seventh N-type transistor;

the seventh N-type transistor, and a gate of the seventh N-type transistor is electrically coupled to the driving output end of the N−1th GOA unit which is the former stage of the Nth GOA unit, and a source is electrically coupled to the drain of the sixth P-type transistor, and a drain is electrically coupled to the low voltage source;

an eighth N-type transistor, and the gate of the eighth N-type transistor is electrically coupled to the driving output end of the N+1th GOA unit which is the latter stage of the Nth GOA unit, and the source is electrically coupled to the drain of the sixth P-type transistor, and a drain is electrically coupled to the low voltage source;

a ninth P-type transistor, and a gate of the ninth P-type transistor is electrically coupled to the drain of the sixth P-type transistor, and a source is electrically coupled to the high voltage source, and a drain is electrically coupled to a source of a tenth N-type transistor;

the tenth N-type transistor, and a gate of the tenth N-type transistor is electrically coupled to the drain of the sixth P-type transistor, and the source is electrically coupled to the drain of the ninth P-type transistor, and a drain is electrically coupled to the low voltage source;

an eleventh P-type transistor, a gate of the eleventh P-type transistor is electrically coupled to the drain of the sixth P-type transistor, and a source is electrically coupled to a source of a twelfth N-type transistor, and a drain is electrically coupled to the M−2th sequence signal;

the twelfth N-type transistor, and a gate of the twelfth N-type transistor is electrically coupled to the drain of the ninth P-type transistor, and the source is electrically coupled to the source of the eleventh P-type transistor, and a drain is electrically coupled to the M−2th sequence signal;

the information storage part comprises:

a thirteenth N-type transistor, and a gate of the thirteenth N-type transistor is electrically coupled to the source of the eleventh P-type transistor, and a source is electrically coupled to a drain of a fourteenth P-type transistor, and a drain is electrically coupled to the low voltage source;

the fourteenth P-type transistor, and a gate of the fourteenth P-type transistor is electrically coupled to the source of the eleventh P-type transistor, and a source is electrically coupled to the high voltage source, and the drain is electrically coupled to the source of the thirteenth N-type transistor;

a fifteenth P-type transistor, and a gate of the fifteenth P-type transistor is electrically coupled to the source of the thirteenth N-type transistor, and a source is electrically coupled to the high voltage source, and a drain is electrically coupled to a source of a sixteenth P-type transistor;

the sixteenth P-type transistor, and a gate of the sixteenth P-type transistor is electrically coupled to the first node, and the source is electrically coupled to the drain of the fifteenth P-type transistor, and a drain is electrically coupled to a source of a seventeenth N-type transistor;

the seventeenth N-type transistor, and a gate of the sixteenth P-type transistor is electrically coupled to the first node, and the source is electrically coupled to the drain of the sixteenth P-type transistor, and a drain is electrically coupled to a source of an eighteenth N-type transistor;

the eighteenth N-type transistor, and a gate of the eighteenth N-type transistor is electrically coupled to the source of the eleventh P-type transistor, and the source is electrically coupled to the drain of the seventeenth N-type transistor, and a drain is electrically coupled to the low voltage source;

a nineteenth P-type transistor, and a gate of the nineteenth P-type transistor is electrically coupled to the gate of the thirteenth N-type transistor, and a source is electrically coupled to the high voltage source, and a drain is electrically coupled to a source of a twentieth P-type transistor;

the twentieth P-type transistor, and a gate of the twentieth P-type transistor is electrically coupled to the second node, and the source is electrically coupled to the drain of the nineteenth P-type transistor, and a drain is electrically coupled to a source of a twenty-first N-type transistor;

the twenty-first N-type transistor, and a gate of the twenty-first N-type transistor is electrically coupled to the second node, and the source is electrically coupled to the drain of the twentieth P-type transistor, and a drain is electrically coupled to a source of a twenty-second N-type transistor;

the twenty-second N-type transistor, and a gate of the twenty-second N-type transistor is electrically coupled to the source of the thirteenth N-type transistor, and the source is electrically coupled to the drain of the twenty-first N-type transistor, and a drain is electrically coupled to the low voltage source;

the data erase part comprises:

a twenty-third P-type transistor, and a gate of the twenty-third P-type transistor is electrically coupled to the reset signal end, and a source is electrically coupled to the high voltage source, and a drain is electrically coupled to the drain of the sixteenth P-type transistor and the drain of the twentieth P-type transistor;

the output control part comprises:

a twenty-fourth P-type transistor, and a gate of the twenty-fourth P-type transistor is electrically coupled to the drain of the sixteenth P-type transistor and the drain of the twentieth P-type transistor, and a source is electrically coupled to the high voltage source, and a drain is electrically coupled to the driving output end;

a twenty-fifth N-type transistor, and a gate of the twenty-fifth N-type transistor is electrically coupled to the drain of the sixteenth P-type transistor and the drain of the twentieth P-type transistor, and a source is electrically coupled to the driving output end, and a drain is electrically coupled to the low voltage source;

a twenty-sixth P-type transistor, and a gate of the twenty-sixth P-type transistor is electrically coupled to the driving output end, and a source is electrically coupled to the high voltage source, and a drain is electrically coupled to a source of a twenty-ninth N-type transistor;

a twenty-seventh N-type transistor, and a gate of the twenty-seventh N-type transistor is electrically coupled to the driving output end, and a source is electrically coupled to a drain of the twenty-ninth N-type transistor, and a drain is electrically coupled to the low voltage source;

a twenty-eighth P-type transistor, and a gate of the sixteenth P-type transistor is electrically coupled to the sequence signal, and a source is electrically coupled to the high voltage source, and a drain is electrically coupled to the source of the twenty-ninth N-type transistor;

the twenty-ninth N-type transistor, and a gate of the twenty-ninth N-type transistor is electrically coupled to the sequence signal, and the source is electrically coupled to the drain of twenty-sixth P-type transistor, and a drain is electrically coupled to the source of the twenty-seventh N-type transistor;

the output buffer part comprises:

a thirtieth P-type transistor, and a gate of the thirtieth P-type transistor is electrically coupled to the source of the twenty-ninth N-type transistor, and a source is electrically coupled to the high voltage source, and a drain is electrically coupled to a source of a thirty-first N-type transistor;

the thirty-first N-type transistor, and a gate of the thirty-first N-type transistor is electrically coupled to the source of the twenty-ninth N-type transistor, and the source is electrically coupled to the drain of the thirtieth P-type transistor, and a drain is electrically coupled to the low voltage source;

a thirty-second P-type transistor, and a gate of the thirty-second P-type transistor is electrically coupled to the drain of the thirtieth P-type transistor, and a source is electrically coupled to the high voltage source, and a drain is electrically coupled to a source of a thirty-third N-type transistor;

the thirty-third N-type transistor, and a gate of the thirty-third N-type transistor is electrically coupled to the drain of the thirtieth P-type transistor, and the source is electrically coupled to the drain of the thirty-second P-type transistor, and a drain is electrically coupled to the low voltage source;

a thirty-fourth P-type transistor, and a gate of the thirty-fourth P-type transistor is electrically coupled to the drain of the thirty-second P-type transistor, and a source is electrically coupled to the high voltage source, and a drain is electrically coupled to the output end;

a thirty-fifth N-type transistor, and a gate of the thirty-fifth N-type transistor is electrically coupled to the drain of the thirty-second P-type transistor, and a source is electrically coupled to the output end, and a drain is electrically coupled to the low voltage source;

wherein the gate of the eighteenth N-type transistor and the gate of the nineteenth P-type transistor are connected to each other.

2. The GOA circuit of LTPS semiconductor TFT according to claim 1, wherein the GOA circuit further comprises a second output control part, a second output buffer part;

the second output control part is electrically coupled to the output control part, the driving output end, an M+1th sequence signal, the high voltage source and the low voltage source; the second output buffer part is electrically coupled to the second output control part, an output end of the N+1th GOA unit, the high voltage source and the low voltage source;

the second output control part comprises:

a thirty-sixth P-type transistor, and a gate of the thirty-sixth P-type transistor is electrically coupled to the driving output end, and a source is electrically coupled to the high voltage source, and a drain is electrically coupled to a source of a thirty-ninth N-type transistor;

a thirty-seventh N-type transistor, and a gate of the thirty-seventh N-type transistor is electrically coupled to the driving output end, and a source is electrically coupled to the drain of the thirty-ninth N-type transistor, and a drain is electrically coupled to the low voltage source;

a thirty-eighth P-type transistor, and a gate of the thirty-eighth P-type transistor is electrically coupled to an M+1th sequence signal, and a source is electrically coupled to the high voltage source, and a drain is electrically coupled to the source of the thirty-ninth N-type transistor;

the thirty-ninth N-type transistor, and a gate of the thirty-ninth N-type transistor is electrically coupled to the M+1th sequence signal, and the source is electrically coupled to the drain of the thirty-sixth P-type transistor, and the drain is electrically coupled to the source of the thirty-seventh N-type transistor;

the second output buffer part comprises:

a fortieth P-type transistor, and a gate of the fortieth P-type transistor is electrically coupled to the source of the thirty-ninth N-type transistor, and a source is electrically coupled to the high voltage source, and a drain is electrically coupled to a source of a forty-first N-type transistor;

the forty-first N-type transistor, and a gate of the forty-first N-type transistor is electrically coupled to the source of the thirty-ninth N-type transistor, and the source is electrically coupled to the drain of the fortieth P-type transistor, and a drain is electrically coupled to the low voltage source;

a forty-second P-type transistor, and a gate of the forty-second P-type transistor is electrically coupled to the drain of the fortieth P-type transistor, and a source is electrically coupled to the high voltage source, and a drain is electrically coupled to a source of a forty-third N-type transistor;

the forty-third N-type transistor, and a gate of the forty-third N-type transistor is electrically coupled to the drain of the fortieth P-type transistor, and the source is electrically coupled to the drain of the forty-second P-type transistor, and a drain is electrically coupled to the low voltage source;

a forty-fourth P-type transistor, and a gate of the forty-fourth P-type transistor is electrically coupled to the drain of the forty-second P-type transistor, and a source is electrically coupled to the high voltage source, and a drain is electrically coupled to an output end of the N+1th GOA unit;

a forty-fifth N-type transistor, and a gate of the forty-fifth N-type transistor is electrically coupled to the drain of the forty-second P-type transistor, and a source is electrically coupled to the output end of the N+1th GOA unit, and a drain is electrically coupled to the low voltage source.

3. The GOA circuit of LTPS semiconductor TFT according to claim 1, wherein in the first stage connection, all the source of the first P-type transistor, the source of the second N-type transistor, the gate of the fifth P-type transistor, the gate of the seventh N-type transistor are electrically coupled to an activation signal end of the circuit.

4. The GOA circuit of LTPS semiconductor TFT according to claim 1, wherein in the last stage connection, all the source of the third P-type transistor, the source of the fourth N-type transistor, the gate of the sixth P-type transistor, the gate of the eighth N-type transistor are electrically coupled to the activation signal end of the circuit.

5. The GOA circuit of LTPS semiconductor TFT according to claim 1, wherein in the transmission part, the first P-type transistor and the second N-type transistor construct a forward transmission gate, employed to forward transmit a driving output signal of the N−1th GOA unit to the information storage part; the third P-type transistor and the fourth N-type transistor construct a backward transmission gate, employed to backward transmit a driving output signal of the N+1th GOA unit to the information storage part.

6. The GOA circuit of LTPS semiconductor TFT according to claim 1, wherein in the transmission control part, the fifth P-type transistor, the sixth P-type transistor, the seventh N-type transistor, the eighth N-type transistor, construct a NOR gate logic unit; the ninth P-type transistor, the tenth N-type transistor construct an inverter; the eleventh P-type transistor, the twelfth N-type transistor construct a transmission gate; the transmission control part is employed to control the M-2th sequence signal and transmits it to the information storage part.

7. The GOA circuit of LTPS semiconductor TFT according to claim 1, wherein in the information storage part, the fifteenth P-type transistor, the sixteenth P-type transistor, the seventeenth N-type transistor, the eighteenth N-type transistor construct a forward sequence inverter; the nineteenth P-type transistor, the twentieth P-type transistor, the twenty-first N-type transistor, the twenty-second N-type transistor construct a backward sequence inverter; the thirteenth N-type transistor, the fourteenth P-type transistor construct an inverter; the information storage part is employed to save and transmit the signals from the driving output end of the N−1th GOA unit, the driving output end of the N+1th GOA unit and the M−2th sequence signal.

8. The GOA circuit of LTPS semiconductor TFT according to claim 1, wherein the data erase part is employed to erase the voltage level of the driving output end of the circuit in due time.

9. The GOA circuit of LTPS semiconductor TFT according to claim 1, wherein in the output control part, the twenty-sixth P-type transistor, the twenty-seventh N-type transistor, the twenty-eighth P-type transistor and the twenty-ninth N-type construct a NAND gate logic unit; the twenty-fourth P-type transistor, twenty-fifth N-type transistor construct an inverter; the output control part is employed to control a scan signal outputted by the output end to output the scan signal according with time sequence.

10. The GOA circuit of LTPS semiconductor TFT according to claim 1, wherein in the output buffer part, the thirtieth P-type transistor and the thirty-first N-type transistor, the thirty-second P-type transistor and the thirty-third N-type transistor, the thirty-fourth P-type transistor and thirty-fifth N-type transistor respectively construct three inverters, employed to adjust the scan signal with a done sequence adjustment, and meanwhile, to strengthen a band loading capacity.

11. The GOA circuit of LTPS semiconductor TFT according to claim 2, wherein in the second output control part, the thirty-sixth P-type transistor, the thirty-seventh N-type transistor, the thirty-eighth P-type transistor, the thirty-ninth N-type transistor construct a NAND gate logic unit, employed to control the scan signal outputted by the output end of the N+1th GOA unit to output the scan signal according with time sequence; in the second output buffer part, the fortieth P-type transistor and the forty-first N-type transistor, the forty-second P-type transistor and the forty-third N-type transistor, the forty-fourth P-type transistor and the forty-fifth N-type transistor respectively construct three inverters, employed to adjust the scan signal with a done sequence adjustment, and meanwhile, to strengthen a band loading capacity;

the second output control part and the second output buffer part output a scan signal of the latter stage from the output end of the N+1th GOA unit according to the outputted signal of the driving output end and the M+1th sequence signal to realize that the single stage GOA unit controls two stage circuits forward-backward bidirectional scan output.

12. The GOA circuit of LTPS semiconductor TFT according to claim 2, wherein the sequence signal comprises four sets of sequence signals: a first sequence signal, a second sequence signal, a third sequence signal, a fourth sequence signal, and the M−2th sequence signal is the third sequence signal when the sequence signal is the first sequence signal, and the M−2th sequence signal is the fourth sequence signal when the sequence signal is the second sequence signal, and the M+1th sequence signal is the first sequence signal when the sequence signal is the fourth sequence signal.

13. A GOA circuit of LTPS semiconductor TFT, employed for forward-backward bidirectional scan transmission, comprising a plurality of GOA units which are cascade connected, and N is set to be a positive integer and an Nth GOA unit utilizes a plurality of N-type transistors and a plurality of P-type transistors and comprises a transmission part, a transmission control part, an information storage part, a data erase part, an output control part and an output buffer part;

the transmission part is electrically coupled to a first low frequency signal, a second low frequency signal, a driving output end of an N−1th GOA unit which is the former stage of the Nth GOA unit, a driving output end of an N+1th GOA unit which is the latter stage of the Nth GOA unit and the information storage part; the transmission control part is electrically coupled to the driving output end of the N+1th GOA unit which is the latter stage of the Nth GOA unit, the driving output end of the N−1th GOA unit which is the former stage of the Nth GOA unit, an M−2th sequence signal, a high voltage source, a low voltage source and the information storage part;

the information storage part is electrically coupled to the transmission part, the transmission control part, the data erase part, the high voltage source and the low voltage source; the data erase part is electrically coupled to the information storage part, the output control part, the high voltage source and the reset signal end; the output control part is electrically coupled to the data erase part, the output buffer part, a driving output end, a sequence signal, the high voltage source and the low voltage source; the output buffer part is electrically coupled to the output control part, an output end, the high voltage source and the low voltage source;

voltage levels of the first low frequency signal and the second low frequency signal are switched along with the forward-backward scan, and the first low frequency signal is equivalent to a direct current high voltage level, and the second low frequency signal is equivalent to a direct current low voltage level as forward scan; the first low frequency signal is equivalent to a direct current low voltage level, and the second low frequency signal is equivalent to a direct current high voltage level as backward scan;

the transmission part comprises a first P-type transistor, and a gate of the first P-type transistor is electrically coupled to the second low frequency signal, and a source is electrically coupled to the driving output end of the N−1th GOA unit which is the former stage of the Nth GOA unit, and a drain is electrically coupled to a first node; a second N-type transistor, and a gate of the second N-type transistor is electrically coupled to the first low frequency signal, and a source is electrically coupled to the driving output end of the N−1th GOA unit which is the former stage of the Nth GOA unit, and a drain is electrically coupled to the first node; a third P-type transistor, and a gate of the third P-type transistor is electrically coupled to the first low frequency signal, and a source is electrically coupled to the driving output end of the N+1th GOA unit which is the latter stage of the Nth GOA unit, and a drain is electrically coupled to a second node; a fourth N-type transistor, and a gate of the fourth N-type transistor is electrically coupled to the second low frequency signal, and a source is electrically coupled to the driving output end of the N+1th GOA unit which is the latter stage of the Nth GOA unit, and a drain is electrically coupled to the second node;

the transmission control part comprises:

a fifth P-type transistor, and a gate of the fifth P-type transistor is electrically coupled to the driving output end of the N−1th GOA unit which is the former stage of the Nth GOA unit, and the source is electrically coupled to the high voltage source, and a drain is electrically coupled to a source of a sixth P-type transistor;

the sixth P-type transistor, and a gate of the sixth P-type transistor is electrically coupled to the driving output end of the N+1th GOA unit which is the latter stage of the Nth GOA unit, and a source is electrically coupled to the drain of the fifth P-type transistor, and a drain is electrically coupled to a source of a seventh N-type transistor;

the seventh N-type transistor, and a gate of the seventh N-type transistor is electrically coupled to the driving output end of the N−1th GOA unit which is the former stage of the Nth GOA unit, and a source is electrically coupled to the drain of the sixth P-type transistor, and a drain is electrically coupled to the low voltage source;

an eighth N-type transistor, and the gate of the eighth N-type transistor is electrically coupled to the driving output end of the N+1th GOA unit which is the latter stage of the Nth GOA unit, and the source is electrically coupled to the drain of the sixth P-type transistor, and a drain is electrically coupled to the low voltage source;

a ninth P-type transistor, and a gate of the ninth P-type transistor is electrically coupled to the drain of the sixth P-type transistor, and a source is electrically coupled to the high voltage source, and a drain is electrically coupled to a source of a tenth N-type transistor;

the tenth N-type transistor, and a gate of the tenth N-type transistor is electrically coupled to the drain of the sixth P-type transistor, and the source is electrically coupled to the drain of the ninth P-type transistor, and a drain is electrically coupled to the low voltage source;

an eleventh P-type transistor, a gate of the eleventh P-type transistor is electrically coupled to the drain of the sixth P-type transistor, and a source is electrically coupled to a source of a twelfth N-type transistor, and a drain is electrically coupled to the M−2th sequence signal;

the twelfth N-type transistor, and a gate of the twelfth N-type transistor is electrically coupled to the drain of the ninth P-type transistor, and the source is electrically coupled to the source of the eleventh P-type transistor, and a drain is electrically coupled to the M−2th sequence signal;

the information storage part comprises:

a thirteenth N-type transistor, and a gate of the thirteenth N-type transistor is electrically coupled to the source of the eleventh P-type transistor, and a source is electrically coupled to a drain of a fourteenth P-type transistor, and a drain is electrically coupled to the low voltage source;

the fourteenth P-type transistor, and a gate of the fourteenth P-type transistor is electrically coupled to the source of the eleventh P-type transistor, and a source is electrically coupled to the high voltage source, and the drain is electrically coupled to the source of the thirteenth N-type transistor;

a fifteenth P-type transistor, and a gate of the fifteenth P-type transistor is electrically coupled to the source of the thirteenth N-type transistor, and a source is electrically coupled to the high voltage source, and a drain is electrically coupled to a source of a sixteenth P-type transistor;

the sixteenth P-type transistor, and a gate of the sixteenth P-type transistor is electrically coupled to the first node, and the source is electrically coupled to the drain of the fifteenth P-type transistor, and a drain is electrically coupled to a source of a seventeenth N-type transistor;

the seventeenth N-type transistor, and a gate of the sixteenth P-type transistor is electrically coupled to the first node, and the source is electrically coupled to the drain of the sixteenth P-type transistor, and a drain is electrically coupled to a source of an eighteenth N-type transistor;

the eighteenth N-type transistor, and a gate of the eighteenth N-type transistor is electrically coupled to the source of the eleventh P-type transistor, and the source is electrically coupled to the drain of the seventeenth N-type transistor, and a drain is electrically coupled to the low voltage source;

a nineteenth P-type transistor, and a gate of the nineteenth P-type transistor is electrically coupled to the gate of the thirteenth N-type transistor, and a source is electrically coupled to the high voltage source, and a drain is electrically coupled to a source of a twentieth P-type transistor;

the twentieth P-type transistor, and a gate of the twentieth P-type transistor is electrically coupled to the second node, and the source is electrically coupled to the drain of the nineteenth P-type transistor, and a drain is electrically coupled to a source of a twenty-first N-type transistor;

pled to the second node, and the source is electrically coupled to the drain of the twentieth P-type transistor, and a drain is electrically coupled to a source of a twenty-second N-type transistor;

the twenty-second N-type transistor, and a gate of the twenty-second N-type transistor is electrically coupled to the source of the thirteenth N-type transistor, and the source is electrically coupled to the drain of the twenty-first N-type transistor, and a drain is electrically coupled to the low voltage source;

the data erase part comprises:

a twenty-third P-type transistor, and a gate of the twenty-third P-type transistor is electrically coupled to the reset signal end, and a source is electrically coupled to the high voltage source, and a drain is electrically coupled to the drain of the sixteenth P-type transistor and the drain of the twentieth P-type transistor;

the output control part comprises:

a twenty-fourth P-type transistor, and a gate of the twenty-fourth P-type transistor is electrically coupled to the drain of the sixteenth P-type transistor and the drain of the twentieth P-type transistor, and a source is electrically coupled to the high voltage source, and a drain is electrically coupled to the driving output end;

twenty-fifth N-type transistor, and a gate of the twenty-fifth N-type transistor is electrically coupled to the drain of the sixteenth P-type transistor and the drain of the twentieth P-type transistor, and a source is electrically coupled to the driving output end, and a drain is electrically coupled to the low voltage source;

a twenty-sixth P-type transistor, and a gate of the twenty-sixth P-type transistor is electrically coupled to the driving output end, and a source is electrically coupled to the high voltage source, and a drain is electrically coupled to a source of a twenty-ninth N-type transistor;

a twenty-seventh N-type transistor, and a gate of the twenty-seventh N-type transistor is electrically coupled to the driving output end, and a source is electrically coupled to a drain of the twenty-ninth N-type transistor, and a drain is electrically coupled to the low voltage source;

a twenty-eighth P-type transistor, and a gate of the sixteenth P-type transistor is electrically coupled to the sequence signal, and a source is electrically coupled to the high voltage source, and a drain is electrically coupled to the source of the twenty-ninth N-type transistor;

the twenty-ninth N-type transistor, and a gate of the twenty-ninth N-type transistor r is electrically coupled to the sequence signal, and the source is electrically coupled to the drain of twenty-sixth P-type transistor, and a drain is electrically coupled to the source of the twenty-seventh N-type transistor;

the output buffer part comprises:

a thirtieth P-type transistor, and a gate of the thirtieth P-type transistor is electrically coupled to the source of the twenty-ninth N-type transistor, and a source is electrically coupled to the high voltage source, and a drain is electrically coupled to a source of a thirty-first N-type transistor;

the thirty-first N-type transistor, and a gate of the thirty-first N-type transistor is electrically coupled to the source of the twenty-ninth N-type transistor, and the source is electrically coupled to the drain of the thirtieth P-type transistor, and a drain is electrically coupled to the low voltage source;

a thirty-second P-type transistor, and a gate of the thirty-second P-type transistor is electrically coupled to the drain of the thirtieth P-type transistor, and a source is electrically coupled to the high voltage source, and a drain is electrically coupled to a source of a thirty-third N-type transistor;

the thirty-third N-type transistor, and a gate of the thirty-third N-type transistor is electrically coupled to the drain of the thirtieth P-type transistor, and the source is electrically coupled to the drain of the thirty-second P-type transistor, and a drain is electrically coupled to the low voltage source;

a thirty-fourth P-type transistor, and a gate of the thirty-fourth P-type transistor is electrically coupled to the drain of the thirty-second P-type transistor, and a source is electrically coupled to the high voltage source, and a drain is electrically coupled to the output end;

a thirty-fifth N-type transistor, and a gate of the thirty-fifth N-type transistor is electrically coupled to the drain of the thirty-second P-type transistor, and a source is electrically coupled to the output end, and a drain is electrically coupled to the low voltage source;

wherein in the transmission part, the first P-type transistor and the second N-type transistor construct a forward transmission gate, employed to forward transmit a driving output signal of the N−1th GOA unit to the information storage part; the third P-type transistor and the fourth N-type transistor construct a backward transmission gate, employed to backward transmit a driving output signal of the N+1th GOA unit to the information storage part;

wherein in the transmission control part, the fifth P-type transistor, the sixth P-type transistor, the seventh N-type transistor, the eighth N-type transistor, construct a NOR gate logic unit; the ninth P-type transistor, the tenth N-type transistor construct an inverter; the eleventh P-type transistor, the twelfth N-type transistor construct a transmission gate; the transmission control part is employed to control the M−2th sequence signal and transmits it to the information storage part;

wherein in the information storage part, the fifteenth P-type transistor, the sixteenth P-type transistor, the seventeenth N-type transistor, the eighteenth N-type transistor construct a forward sequence inverter; the nineteenth P-type transistor, the twentieth P-type transistor, the twenty-first N-type transistor, the twenty-second N-type transistor construct a backward sequence inverter; the thirteenth N-type transistor, the fourteenth P-type transistor construct an inverter;

the information storage part is employed to save and transmit the signals from the driving output end of the N−1th GOA unit, the driving output end of the N+1th GOA unit and the M−2th sequence signal;

wherein the data erase part is employed to erase the voltage level of the driving output end of the circuit in due time;

wherein in the output control part, the twenty-sixth P-type transistor, the twenty-seventh N-type transistor, the twenty-eighth P-type transistor and the twenty-ninth N-type construct a NAND gate logic unit; the twenty-fourth P-type transistor, twenty-fifth N-type transistor construct an inverter; the output control part is employed to control a scan signal outputted by the output end to output the scan signal according with time sequence;

wherein in the output buffer part, the thirtieth P-type transistor and the thirty-first N-type transistor, the thirty-second P-type transistor and the thirty-third N-type transistor, the thirty-fourth P-type transistor and thirty-fifth N-type transistor respectively construct three inverters, employed to adjust the scan signal with a done sequence adjustment, and meanwhile, to strengthen a band loading capacity;

wherein the gate of the eighteenth N-type transistor and the gate of the nineteenth P-type transistor are connected to each other.

\* \* \* \* \*